United States Patent [19]
Barrow

[11] Patent Number: 5,898,219
[45] Date of Patent: Apr. 27, 1999

[54] CUSTOM CORNER ATTACH HEAT SINK DESIGN FOR A PLASTIC BALL GRID ARRAY INTEGRATED CIRCUIT PACKAGE

[75] Inventor: Michael Barrow, El Dorado Hills, Calif.

[73] Assignee: Intel Corporation, Santa Clara, Calif.

[21] Appl. No.: 08/832,417

[22] Filed: Apr. 2, 1997

[51] Int. Cl.$^6$ ............... H01L 23/34; H01L 23/10; H01L 23/48
[52] U.S. Cl. ............. 257/713; 257/706; 257/693; 257/697; 257/678
[58] Field of Search ...................... 257/713, 787, 257/675, 668, 678, 685, 686, 690, 693, 697, 704, 706, 718, 719, 722, 688

[56] References Cited

U.S. PATENT DOCUMENTS

| | | | |
|---|---|---|---|
| 4,814,943 | 3/1989 | Okuaki | 361/400 |
| 5,367,435 | 11/1994 | Andros et al. | 257/686 |
| 5,483,099 | 1/1996 | Natarajan et al. | 257/691 |
| 5,552,635 | 9/1996 | Kim et al. | 257/712 |

Primary Examiner—Mahshid Saadat
Assistant Examiner—Jhihan B. Clark
Attorney, Agent, or Firm—Blakely, Sokoloff, Taylor & Zafman LLP

[57] ABSTRACT

An integrated circuit package. The package includes a substrate which has a first surface, a second opposite surface and four corners. Each corner has a conductive plane and at least one via. The vias connect the conductive planes of the first surface with corresponding conductive planes located on the second surface of the substrate. An integrated circuit is mounted to the first surface of the substrate and enclosed by plastic. Solder balls are attached to the conductive planes and a number of individual solder pads located on the second surface of the package. The contacts are connected to a printed circuit board. A lid is attached to the conductive planes at the four corners of the substrate. Some of the heat generated by the integrated circuit conducts through the substrate and into the printed circuit board. Some of the heat within the substrate conducts into the lid through the conductive planes located at the corners of the package. The present invention thus provides two thermal paths, the printed circuit board and the lid, from the substrate of a plastic integrated circuit package.

10 Claims, 2 Drawing Sheets

CUSTOM CORNER ATTACH HEAT SINK DESIGN FOR A PLASTIC BALL GRID ARRAY INTEGRATED CIRCUIT PACKAGE

BACKGROUND OF THE INVENTION

1. Field of the Invention

The present invention relates to an integrated circuit package.

2. Description of Related Art

Integrated circuits are typically assembled into a package that is mounted to a printed circuit board. There are a number of different types of packages including quad flat pack (QFP), pin grid array (PGA) and ball grid array (BGA). BGA packages include a number of solder balls that are soldered to corresponding solder pads located on the bottom surface of a substrate. The solder balls are reflowed to attach the substrate to a printed circuit board.

An integrated circuit is mounted to a top surface of the substrate. The integrated circuit is connected to bond pads located on the top surface of the substrate by wire bonds. The bond pads are connected to the solder pads on the second surface by a number of vias and routing traces formed within the substrate. The integrated circuit is enclosed by a molded plastic material.

The heat generated by the integrated circuit conducts into the printed circuit board through the vias, the routing traces and the solder balls. The vias and routing traces have a relatively high thermal impedance. The high thermal impedance creates an undesirable temperature differential between the circuit board and the integrated circuit. The high temperature differential may create junction temperatures which exceed the recommended operating limits of the integrated circuit. Some packages incorporate heat slugs which remove heat from the top surface of the integrated circuit die. Heat slugs add to the complexity and cost of mass producing the package. It would be desirable to provide an integrated circuit package that provides an alternate thermal path for heat to flow from the substrate to reduce the overall thermal impedance of the package.

SUMMARY OF THE INVENTION

The present invention is an integrated circuit package. The package includes a substrate which has a first surface, a second opposite surface and a corner. Each corner has a conductive plane located on the first surface of the substrate. An integrated circuit is mounted to the first surface of the substrate. A lid is attached to the conductive plane at the corner of the substrate.

DETAILED DESCRIPTION OF THE INVENTION

Figure 1:
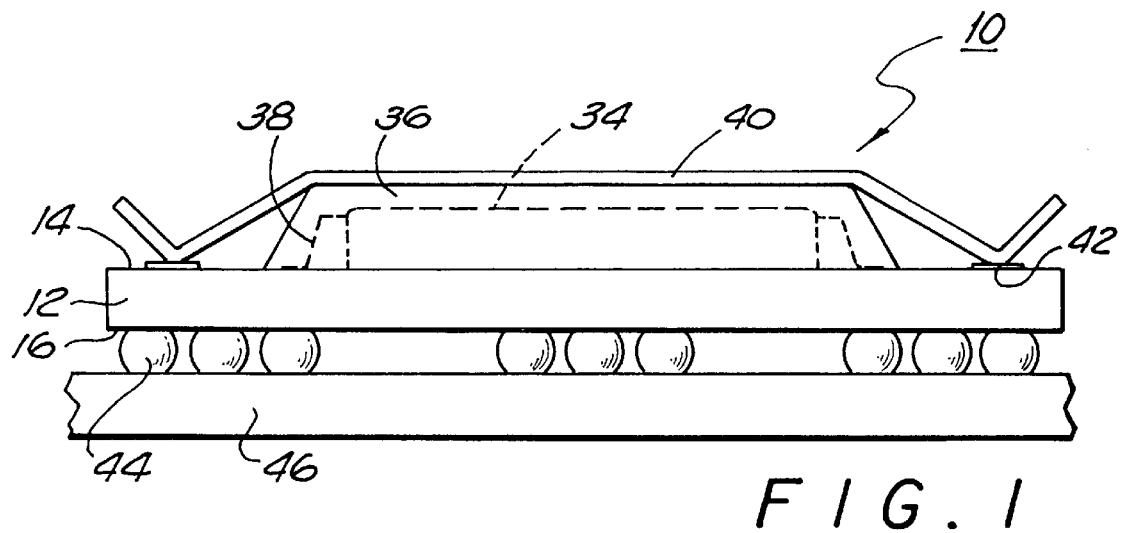
FIG. 1 is a cross-sectional view of an integrated circuit package of the present invention.
Figure 2:
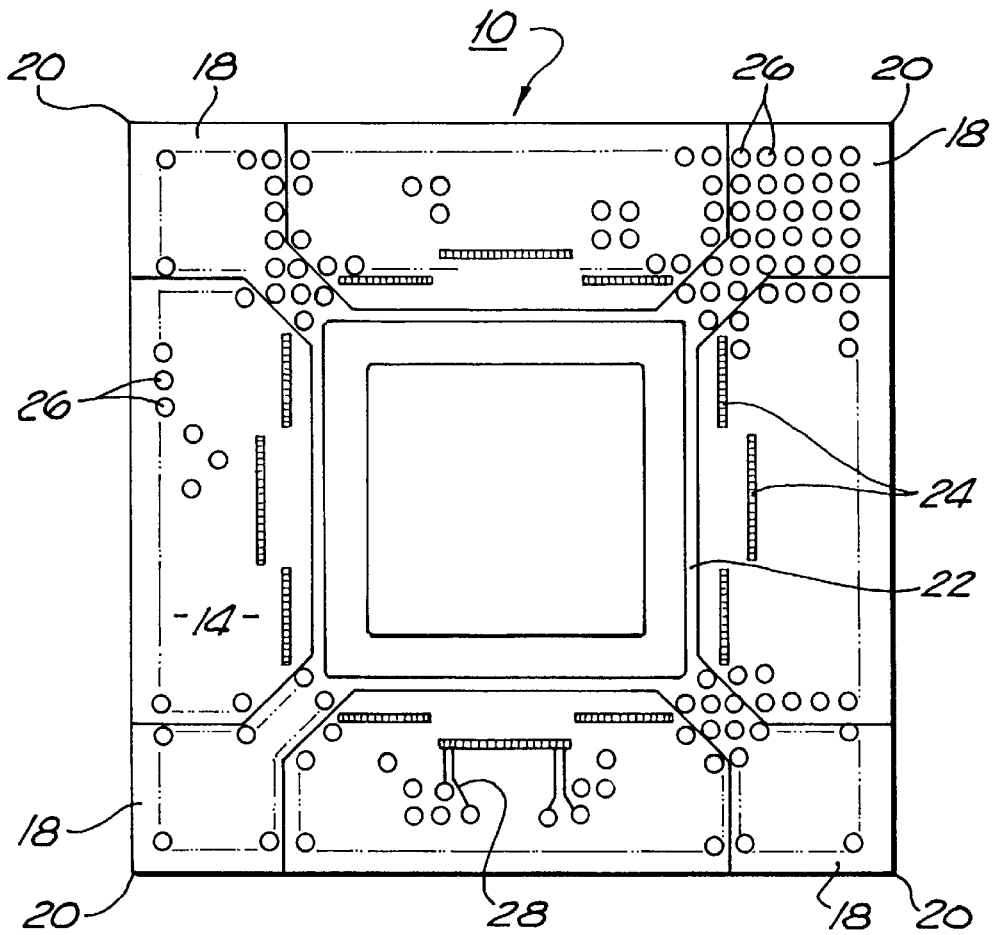
FIG. 2 is a top view of a substrate of the package.
Figure 3:
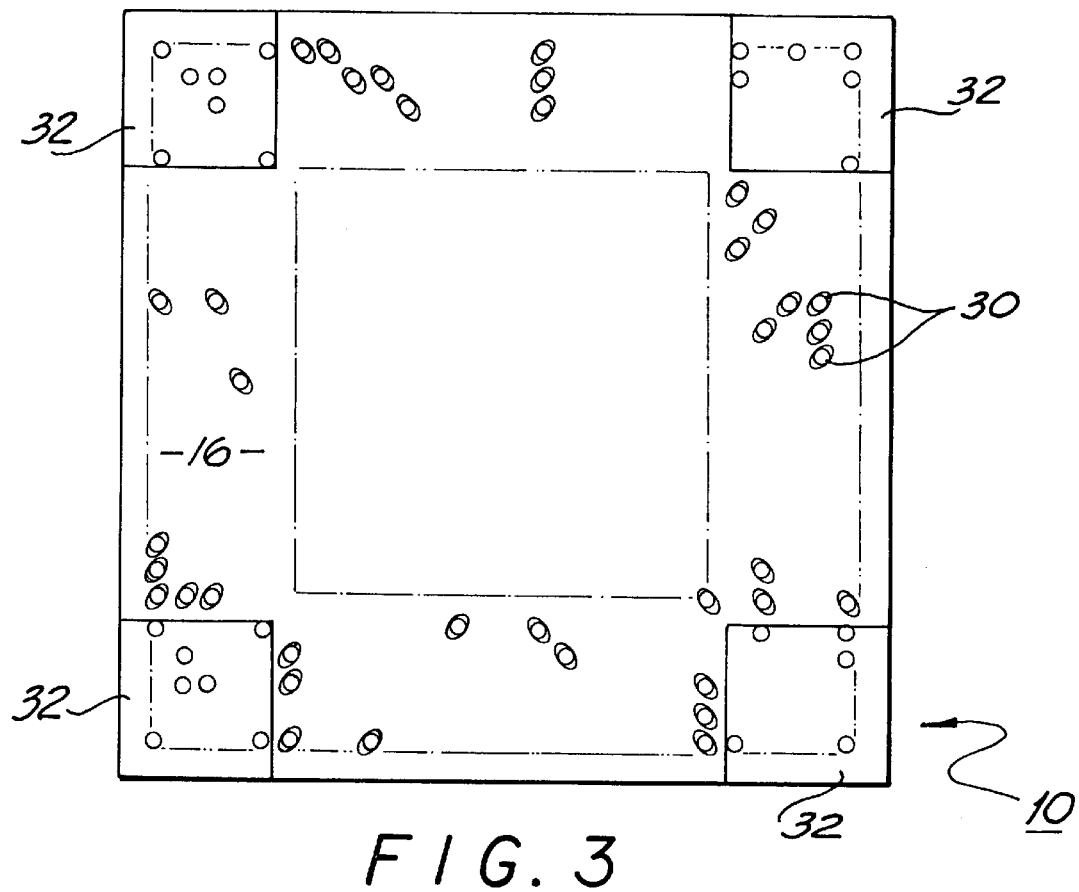
FIG. 3 is a bottom view of the substrate.

Referring to the drawings more particularly by reference numbers, FIGS. 1–3 show an integrated circuit package 10 of the present invention. The integrated circuit package 10 includes a substrate 12 which has a first surface 14 and an opposite second surface 16.

As shown in FIG. 2, the first surface 14 has a number of conductive planes 18 at the four corners 20 of the substrate 12. The first surface 14 also has a conductive ring 22 and a plurality of bond pads 24. As one embodiment, the conductive ring 22 is dedicated to electrical ground and connected to the conductive planes 18. The bond pads 24 are preferably arranged into staggered rows to accommodate the conductive planes 18. The conductive planes 18 are coupled a number of vias 26 that extend through the substrate 12. The bond pads 24 are connected to the vias 26 by routing traces 28.

As shown in FIG. 3, the vias 26 are connected to a plurality of solder pads 30 located on the second surface 16 of the substrate 12. The solder pads 30 preferably have an elliptical shape to increase the peel strength of the pads 30. The second surface 16 also has a plurality of conductive planes 32 located at the four corners 20 of the substrate 12. The conductive planes 32 of the second surface 18 are electrically and thermally coupled to the conductive planes 18 of the first surface 14 by the vias 26.

Referring to FIG. 1, an integrated circuit 34 is mounted to the first surface 14 of the substrate 12 and enclosed by plastic 36. The integrated circuit 34 is connected to the bond pads 24 and conductive ring 22 by a plurality of bond wires 38. The integrated circuit 34 may be a microprocessor, although it is to be understood that the circuit 34 may be any active or passive electrical device(s).

The plastic covered integrated circuit 34 is enclosed by a thermally conductive lid 40. The conductive lid 40 is attached to the conductive planes 18 at the four corners 20 of the substrate 12. The lid 40 may be attached to the planes 18 with a thermally conductive adhesive or epoxy 42.

Contacts 44 are attached to the solder pads 30 located on the second surface 16 of the substrate 12. The contacts 44 are attached to a printed circuit board 46. The contacts 44 are preferably solder balls that are initially attached to the solder pads 30 and then reflowed to attach the package 10 to the printed circuit board 46. The integrated circuit 34 is electrically connected to the printed circuit board 46 through the bond wires 38, bond pads 24, vias 26, solder pads 30 and contacts 44. Although a ball grid array (BGA) type of package is shown and described, it is to be understood that other types of packages can be implemented with the present invention.

The heat generated by the integrated circuit 34 will flow into the substrate 12. Some of the heat will flow through the substrate 12 and into the circuit board 46. Some of the heat within the substrate 12 will flow into the conductive planes 18 and the lid 40 where the heat is removed by forced and/or natural convection. The lid 40 provides an additional thermal path which can efficiently remove heat from a plastic integrated circuit package.

The package 10 can be assembled by mounting and wire bonding the integrated circuit 34 to the substrate 12. The integrated circuit 34 is enclosed by molded plastic 36. The lid 40 is then attached to the conductive planes 18 at the four corners of the substrate 12. The contacts 44 are attached to the solder pads 30. The package 10 is then mounted to the printed circuit board 46 by reflowing the contacts 44 onto the board 46.

Figure 4:
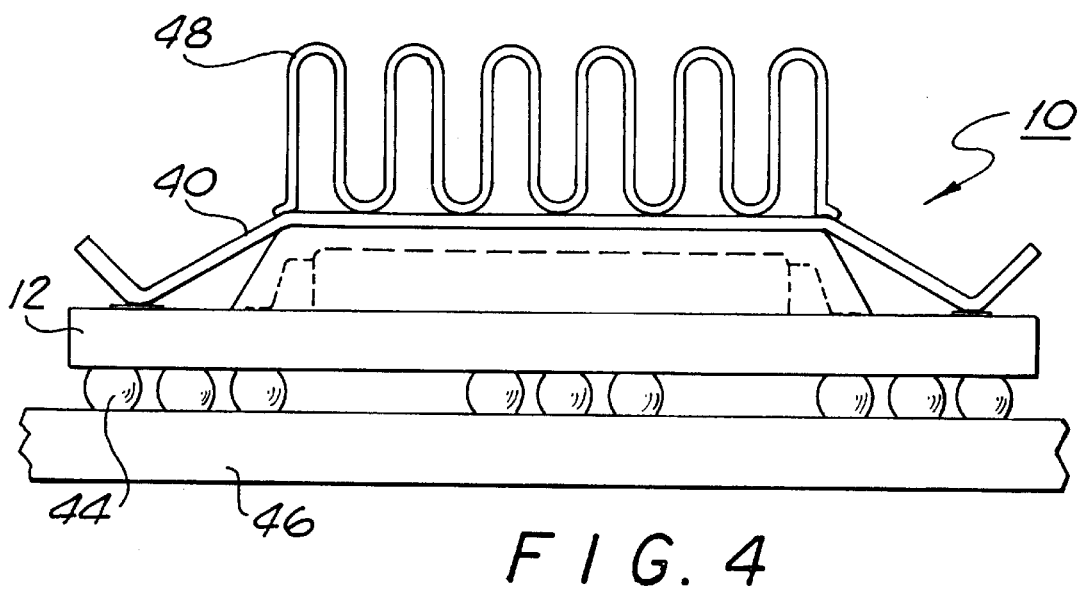
FIG. 4 is a cross-sectional view of an alternate embodiment of a package with a heat sink.

FIG. 4 shows an alternate embodiment, wherein a heat sink 48 is attached to the thermally conductive lid 40. The heat sink 48 improves the heat transfer rate from the package 10 to the surrounding ambient.

What is claimed is:

1. An integrated circuit package, comprising:

a substrate which has a first surface, an opposite second surface and a corner, said corner having a conductive plane on said first surface;

an integrated circuit that is mounted to said first surface of said substrate;

a plastic that encloses said integrated circuit; and, a thermally conductive lid that is attached by a thermally conductive adhesive to said conductive planes at said corner of said substrate and extends around said plastic.

2. The package as recited in claim 1, further comprising a conductive plane that is coupled on said second surface of said substrate, and a via that couples said conductive planes of said first and second surfaces.

3. The package as recited in claim 1, wherein said substrate has a conductive ring that is connected to said conductive planes and coupled to said integrated circuit.

4. The package as recited in claim 1, further comprising a heat sink that is attached to said thermally conductive lid.

5. The package as recited in claim 1, wherein said integrated circuit is attached to a plurality of bond pads of said substrate, wherein said bond pads are arranged in staggered rows.

6. The package as recited in claim 2, further comprising a solder ball that is attached to said second surface of said substrate.

7. An electronic package assembly, comprising:

a substrate which has a first surface, an opposite second surface and four corners, each corner having a conductive plane on said first surface and said second surface, a via that extends through said substrate to connect said conductive planes of said first surface and said second surface, and a conductive ring that is connected to said conductive planes on said first surface;

an integrated circuit that is mounted to said first surface of said substrate and electrically connected to said conductive ring;

a plastic that encloses said integrated circuit;

a thermally conductive lid that is attached to said conductive planes at said four corners of said substrate and extends around said plastic;

a contact that is coupled to said via on said second surface of said substrate; and, printed circuit board that is attached to said contact.

8. The assembly as recited in claim 7, wherein said contact is a solder ball.

9. The assembly as recited in claim 7, further comprising a heat sink that is attached to said thermally conductive lid.

10. The assembly as recited in claim 7, wherein said integrated circuit is attached to a plurality of bond pads of said substrate, wherein said bond pads are arranged in staggered rows.

* * * * *